United States Patent

Seo et al.

[11] Patent Number: 5,849,607
[45] Date of Patent: Dec. 15, 1998

[54] PROCESS FOR ATTACHING A LEAD FRAME TO A SEMICONDUCTOR CHIP

[75] Inventors: Dong Soo Seo, Seoul; Wan Gyun Choi, Puchon; Young Jae Song, Songnam; Jae Myung Park, Seoul, all of Rep. of Korea

[73] Assignee: Samsung Electronics Co., Ltd., Sywon, Rep. of Korea

[21] Appl. No.: 598,849

[22] Filed: Feb. 9, 1996

Related U.S. Application Data

[63] Continuation-in-part of Ser. No. 328,655, Oct. 25, 1994, abandoned.

[30] Foreign Application Priority Data

Nov. 27, 1993 [KR] Rep. of Korea ............... 93-25488

[51] Int. Cl.$^6$ ............................. H01L 21/56; H01L 21/60
[52] U.S. Cl. ........................ 438/114; 438/118; 438/123; 438/465
[58] Field of Search ................................. 438/461, 611, 438/465, 613, 615, 123, 386, 387, 342, 343, 114, 118

[56] References Cited

U.S. PATENT DOCUMENTS

| | | |
|---|---|---|
| 4,515,828 | 5/1985 | Economy et al. . |
| 5,012,322 | 4/1991 | Guillotte et al. . |
| 5,086,018 | 2/1992 | Conru et al. . |
| 5,147,210 | 9/1992 | Patterson et al. . |
| 5,168,345 | 12/1992 | Brossart . |
| 5,317,049 | 5/1994 | Rojstaczer et al. . |
| 5,367,765 | 11/1994 | Kusaka . |
| 5,406,124 | 4/1995 | Morita et al. . |
| 5,457,071 | 10/1995 | Dombroski . |

FOREIGN PATENT DOCUMENTS

| | | |
|---|---|---|
| 59-198728 | 11/1984 | Japan . |
| 62-128133 | 6/1987 | Japan . |
| 63-237427 | 10/1988 | Japan . |
| 1-47038 | 2/1989 | Japan . |
| 1-196845 | 8/1989 | Japan . |

*Primary Examiner*—David Graybill
*Attorney, Agent, or Firm*—IP Group of Pillsbury Madison & Sutro LLP

[57] ABSTRACT

A method for manufacturing of a lead-on-chip type semiconductor chip package is disclosed, which comprises the steps of coating a liquid polyimide coating material on the bonding faces of at least one of the inner leads and the bus bars of the lead frame and the semiconductor chip, attaching the semiconductor chip by using the cured liquid polyimide coating material as an attaching medium, and forming a package body for wrapping and protecting the semiconductor chip and bonding wires. Since the liquid polyimide coating material protects the wafer from which the chips are obtained and also serves as a bonding agent for the semiconductor chip at the same time, the semiconductor chip package according to the present invention can be protected from damage, such as by air bubbles, which are generated at the interface of the conventional polyimide tape, and by separation and expansion of adhesives. Consequently, the method is applicable to a semiconductor chip package having a thickness that is thinner than that of conventional semiconductor chip package.

3 Claims, 5 Drawing Sheets

5,849,607

PROCESS FOR ATTACHING A LEAD FRAME TO A SEMICONDUCTOR CHIP

This is a continuation in part of application Ser. No. 08/328,655, filed Oct. 25, 1994, now abandoned.

BACKGROUND OF THE INVENTION

This invention relates to a method for manufacturing a semiconductor chip package. More particularly, it relates to a method for attaching a semiconductor chip in a lead-on-chip (LOC) semiconductor chip package, to raise the reliability of semiconductor chip package and make the cost of manufacture as low as possible.

In general, a semiconductor chip package refers to a hermetically-sealed container for packing semiconductor chips on which transistors, diodes, integrated circuits, and the like are provided, in order to protect the semiconductor chip characteristics from degradation due to impurities such as moisture, dust, and so on. Also, semiconductor chips having stabilized surfaces, such as planar-type transistors are not always put in a hermetically-sealed container, but are molded by epoxy resin or the like and, in this case, are also called semiconductor chip packages.

Such a semiconductor chip package not only protects the surface of the semiconductor chip from moisture or impurities, but also prevents outside direct resilient power from being added to the semiconductor chip or fine lead.

In the case of a power transistor, it is also important to design the semiconductor chip package appropriately in order to efficiently emit heat generated in the junctions thereof. By the way, semiconductor chips themselves usually become collector junctions in the case of diffuse-type transistors, such as mesa-type or planar-type.

As for very large scale integration circuits (VLSI), recently, the pursuit of small-sized semiconductor chip packages, following the trend toward light, small, and short electronic equipment, makes the mounting of semiconductor chips in a plastic semiconductor chip package having a conventional structure reach the limit.

When it comes to the designs of lead frames and semiconductor chip packages according to semiconductor chip size in the conventional semiconductor chip package, the maximum chip size possible that can be mounted in a chip package reached the limit, and this resulted in the weakness of package reliability.

The conventional LOC technique can increase the chip size which can be mounted on an inner package by a die attaching method using tapes (adhesives coated on a polyimide base film). This has various advantages, such as a characteristic improvement in the aspect of devices as the freedom of the lead frame design increases.

FIG. 1 is a schematic view illustrating a process for manufacturing an LOC-type semiconductor chip package, according to a conventional technique. As shown in FIG. 1, the lead frame 10 (which does not have a die pad) includes leads 11 at regular intervals and bus bars in a plane in which the leads face each other. The leads 11 comprise inner leads and outer leads, which are connected to each other by dam bars 14 which are transversely formed between the inner leads 12 and the outer leads 13.

A polyimide tape 17, having both faces coated with adhesives and being made from a heat-resistant resin, is attached to the lower part of the inner leads 12 and the bus bar 15 on the lead frame 10. The adhesives coated on the tape 17 are then melted by heating them to between 150° C.–400° C. As the polyimide tape 17, polyimide tape known by the trademarks "Kapton" or "Upilex" are usually used. These polyimide tapes are commercially available from the DuPont Co. and from the Ube Co. of Japan, respectively. Then, a center-pad type semiconductor chip 19, having bonding pads formed in the center thereof (not specifically shown) is mounted on the lower part of the inner leads 12 and the bus bar 15 by way of the heated tape 17.

Next, the bonding pads of the semiconductor chip 19, left exposed by the tape 17, are connected to the inner leads 12 using wires (not shown). A package body (not shown) is formed using an epoxy molding compound (EMC) so that it wraps and protects the inner leads 12, the wires, and the semiconductor chip 19.

After the dam bar 14 of the lead frame 10 is removed and divided into respective semiconductor packages through a subsequent process, the outer leads 13 are bent.

FIG. 2 represents a cross-sectional view of an LOC-type semiconductor chip package after the semiconductor chip is attached according to the conventional technique.

A chip mounting process in the conventional LOC-type semiconductor chip package of FIG. 1 is explained hereinafter. The chip mounting process includes a bonding step using a polyimide tape 27 attached to the lower part of the inner leads 22 and to the bus bar 25, and an attaching step to attach the semiconductor chip 29 to the lower part of the polyimide tape 27. These steps can be achieved by heating the tape to 150° C.–400° C., thereby melting adhesives 21, 23 coated on the polyimide tape 27. Therefore, the polyimide tape 17, 27 made from a heat-resistant resin and coated with adhesives 21, 23 on both faces of its base film 26 (for example, Kapton or Upilex) is attached to the lower part of the inner leads 12 and bus bar 15 of the lead frame and the upper part of the semiconductor chip.

The above-described conventional manufacturing method still has problems, however, resulting from using the polyimide tape, since air bubbles are generated by pre-absorbed moisture after a reflow process when the semiconductor chip package is mounted on a PCB. Package cracks are also generated in the thin semiconductor chip package by separation and expansion of the adhesives coated on the base film.

Further, because the polyimide tape has a high hydroscopic property, a prebake unit is additionally required to remove moisture absorbed by the tape, resulting in increased manufacturing costs as compared to other conventional chip packages. The air bubbles generated by the evaporation of pre-absorbed moisture during the relatively high temperature die bonding process (because of the high hydroscopic property of the polyimide tape) degrades the quality and reliability of the resulting chip package. Therefore, extra case must be taken in storing the polyimide tape.

In general, the polyimide tape used for LOC chip has a three-layer structure, in which both faces of a polyimide base film are coated with an adhesive such as epoxy, NBR-phenol resin, polyimide, poly-ether-amide, and polyimidecylic acid to maintain mechanical adhesion strength.

During a reliability test, these adhesives reduce the glass transition temperature Tg due to a moisture absorption. Also, the mechanical strength of the adhesives decline at IR reflow temperature higher than Tg, and package cracks occur due to the inner stress generated by rapid expansion.

SUMMARY OF THE INVENTION

The present invention is to solve the above-described problems of the prior art. The present invention provides a method for manufacturing a semiconductor chip package with reduced manufacturing costs, simplified processes, and improved semiconductor chip package reliability by a process for attaching a semiconductor chip in a LOC-type semiconductor chip package. The present invention includes, generally, the steps of coating a polyimide coating material on bonding faces, connecting the inner leads and the bus bars of the lead frame and said semiconductor chip, attaching a semiconductor chip to said inner leads and bus bars by using said polyimide coating material as a medium forming, and forming a package body for wrapping and protecting said semiconductor chip and a wire.

Other objects, features, and characteristics of the present invention, as well as methods of operation and function of the related elements of structure, and the combination of parts and economies of manufacture, will become more apparent upon consideration of the following detailed description and the appended claims with reference to the accompanying drawings, all of which form a part of this specification.

DETAILED DESCRIPTION OF THE PREFERRED EMBODIMENT

With appended drawings, the following contents are the detailed explanation about a desirable and actual embodiment of a manufacturing method of semiconductor package according to this invention.

Figure 1:
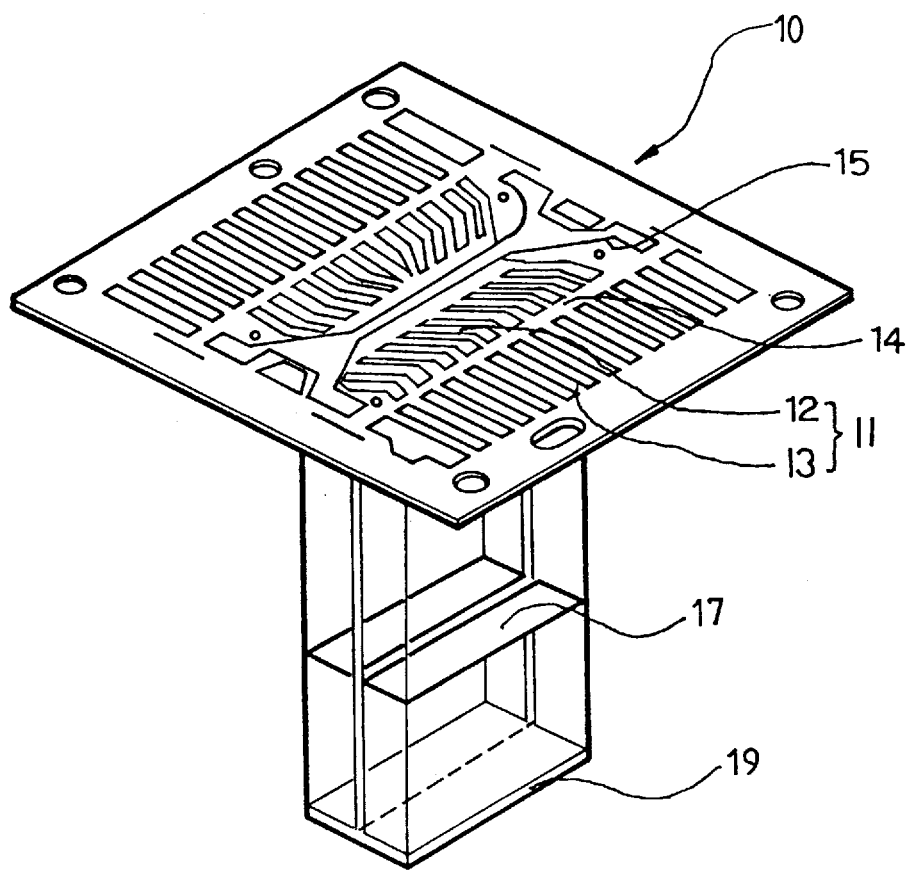
FIG. 1 is a schematic view illustrating a process for manufacturing a LOC-type semiconductor chip package according to a conventional technique.
Figure 2:
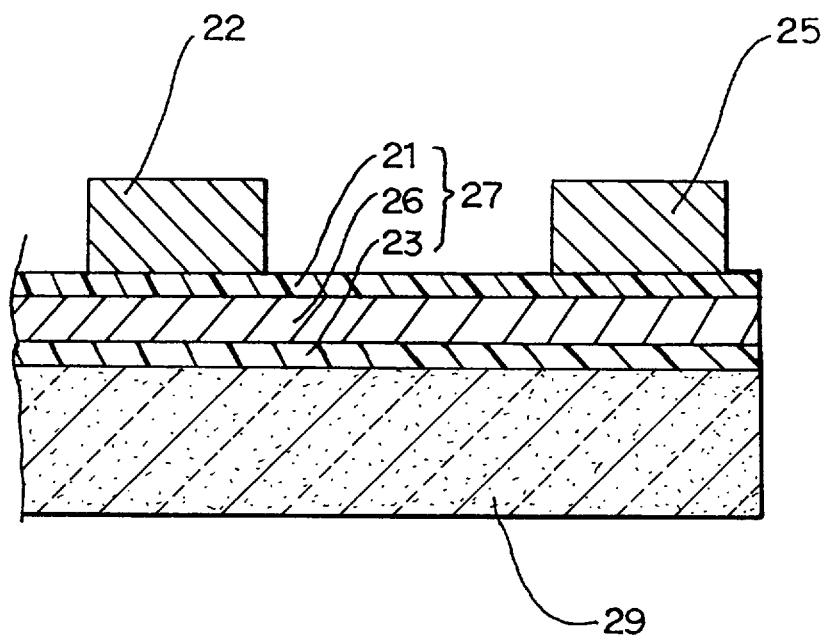
FIG. 2 is a cross-sectional view of the conventional LOC-type semiconductor chip package after a semiconductor chip is attached, according to the conventional technique.
Figure 3:
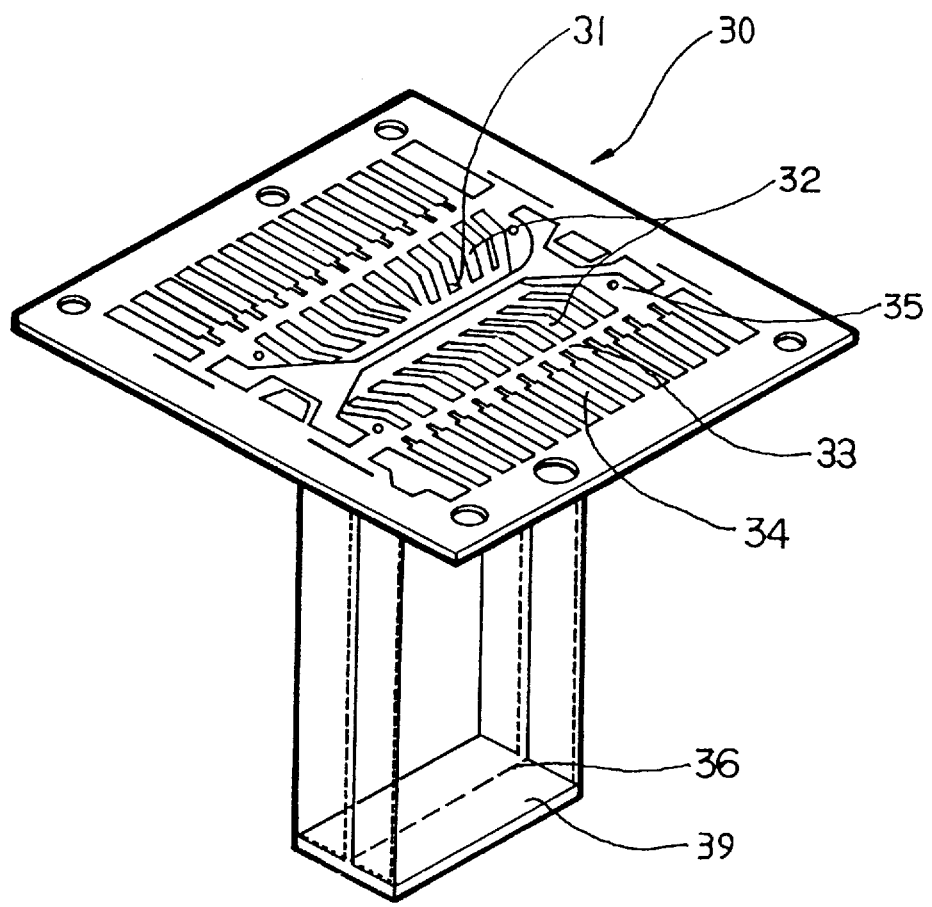
FIG. 3 is a schematic view illustrating a process for manufacturing a LOC-type semiconductor chip package according to this invention.

FIG. 3 is a schematic view illustrating the manufacture of a LOC-type semiconductor chip package according to this invention. As shown in FIG. 3, lead frame 30 includes a plurality of leads 32, dam bars 33, and bus bars 35 connecting the leads 32 with the dam bars 33 to support each other. However, a die pad, as in the prior art, is not provided.

The leads 32 are comprised of inner leads 31 connected to a semiconductor chip 39, and outer leads 34 bent by a subsequent process to establish an external connection. The leads 32 are connected by dam bars 33 which are transversely formed between the inner leads 31 and the outer leads 34. The dam bars 33 are later removed in a trimming process after a package molding process.

A polyimide coating material for protecting the wafer is coated on a bonding face of the semiconductor chip 39 and/or on the lower face of the inner leads 31 and the bus bars 35 to thereby attach the semiconductor chip 39. The semiconductor chip 39 is, for example, a center pad chip in which bonding pads 36 are formed in the center of the semiconductor chip 39.

Figure 4:
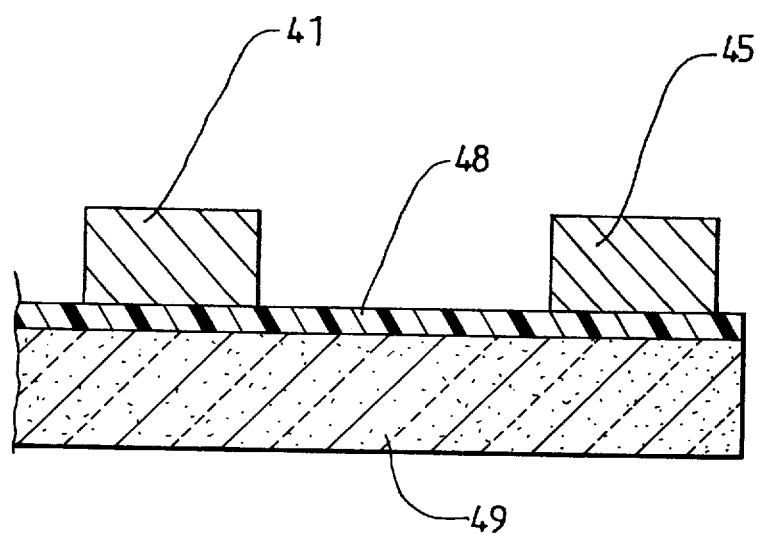
FIG. 4 is a cross-sectional view of the LOC type semiconductor package after a semiconductor chip is attached, according to this invention.
Figure 5:
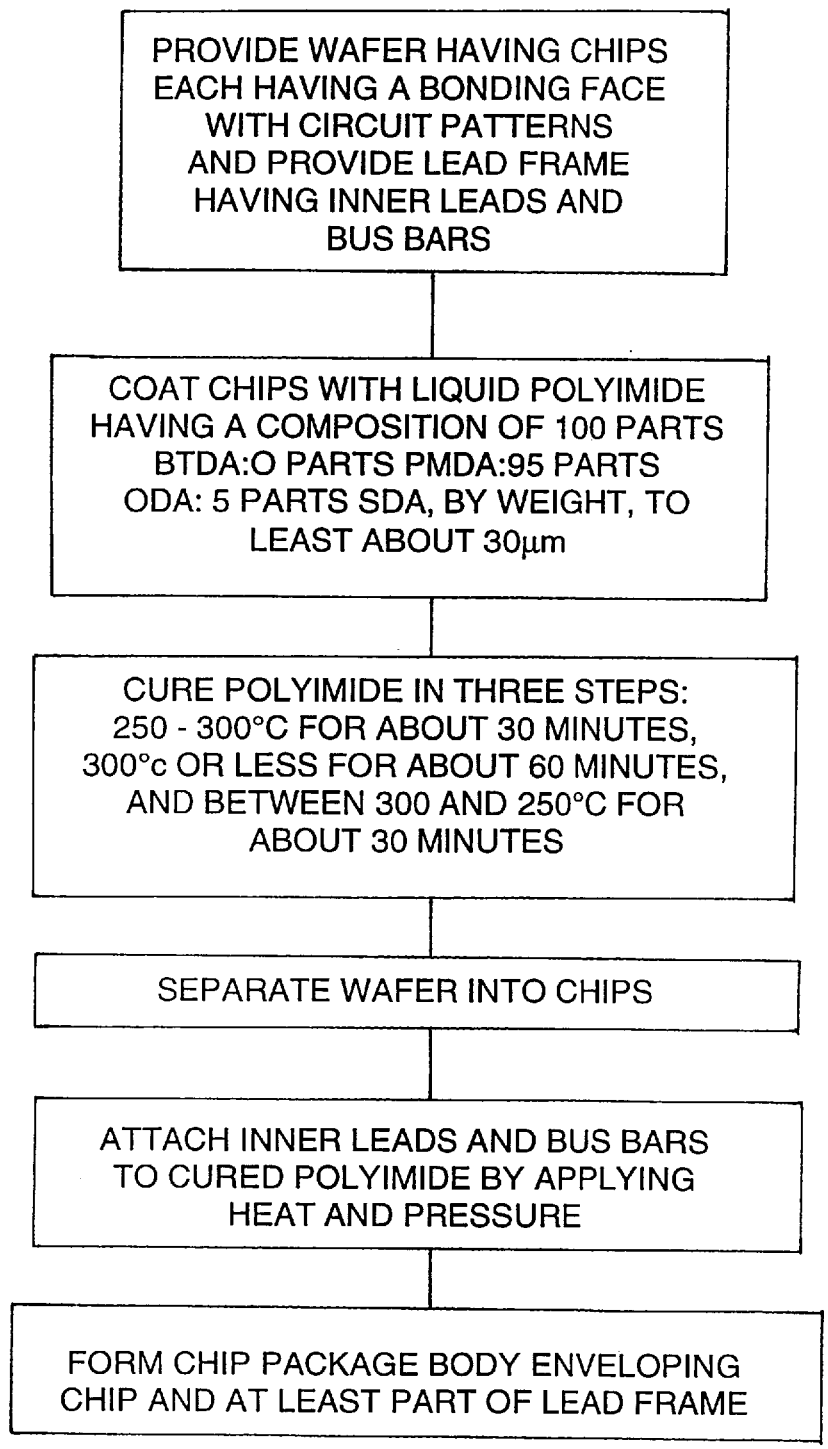
FIG. 5 is a flow chart of the process of the present invention.

FIG. 4 is a cross-sectional view after attaching the semiconductor chip in the LOC type semiconductor chip package according to this invention. As shown in FIG. 4, a polyimide coating material 48 for wafer protection is spread on the lower part of inner leads 41 and bus bar 45.

A polyimide coating liquid for both protecting wafer surface and connecting the lead frame with the semiconductor chip, is used as the polyimide coating material.

First of all, in a process for mounting the semiconductor chip according to the present invention, the polyimide coating material 48 is coated on respective bonding faces of the inner leads 41 and the bus bars 45 and on the bonding face of the semiconductor chip 49 through a spreading process in such a manner that the polyimide coating material has a thickness of about 30 $\mu$m or more.

Therefore, the lead frame and the semiconductor chip 49 are directly connected not by using a polyimide tape, but by heating the polyimide coating material 48 which has adhesive and wafer-protective properties.

The semiconductor chip 49 is attached and mounted by using the polyimide coating liquid coated on the inner leads and the bus bars as an attaching medium in the attaching process.

In one example of the manufacturing process according to the present invention, a liquid polyimide material is coated onto the active surface of a semiconductor wafer by a process such as spin coating. The semiconductor wafer has desired circuitry formed thereon. Preferably, the thickness of the coated liquid polyimide material is at least about 30 $\mu$m so that the circuitry on the active surface of the wafer are not short-circuited or deformed by the lead frame when the chip is attached thereto.

The glass transition temperature Tg of the liquid polyimide coating material is relatively low (e.g., about 254° C.). This is lower than that of the conventional polyimide material, which is 288° C. This reduction in Tg can be realized, for example, by changing the composition of the polymer in the conventional polyimide. That is, the ratio of BTDA:PMDA:ODA:SDA can be changed from 50:50:95:5 (wt%) to 100:0:95:5.

The coated liquid polyimide coating material is thereafter cured in three steps. The first curing step is performed between 250°–300° C. over about 30 minutes. The second curing step is performed at 300° C. or less for about 60 minutes. The third curing step is performed between 300 –250° C. over about 30 minutes.

Next, a photoresist pattern is formed on the cured polyimide material. Bonding pads of the respective semiconductor chip wafers are thereafter exposed by selectively etching the cured polyimide.

The semiconductor wafer is then sawed so as to separate the wafer into individual semiconductor chips, using a known wafer sawing process.

In the course of manufacturing a semiconductor chip package using the thus-obtained semiconductor chips, the inner leads and bus bars of a lead frame are arranged in contact with the polyimide layer of one of the semiconductor chips. The inner leads and the bus bars are adhered thereto by applying heat and pressure (for example, about 20–30 psi at about 350° C.–400° C.) for about 3–5 seconds.

In order to further improve the adhesive bond between the respective parts of the lead frame and the chip, a cooling process may be performed thereafter.

Though it is not shown in the drawings, a package body is subsequently formed to wrap and protect the semiconductor chip and the bonding wires by a molding process. Therefore, this invention simplifies the chip attaching process and reduces manufacturing costs. The manufacturing method also has excellent non-cracking characteristic by directly attaching the inner leads to the polyimide coating material used for wafer element protection.

But, this invention directly attaches the inner leads 41 and the bus bars 45 to the upper part of the semiconductor chip 49. The thickness of the polyimide coating material 48 is controlled appropriately so that damage to circuit elements formed in the inside of the semiconductor chip 49, due to the compression of the inner leads 42 and the bus bars 45 when they are attached to the semiconductor chip, can be prevented. The present invention also secures the appropriate property and the stable etching property after coating in the polyimide coating process.

According to this invention, the manufacturing method of the semiconductor package uses not conventional adhesives, but a polyimide coating material (especially a liquid) protect the wafer element and to bond to the semiconductor chip at the same time. Basically, this method can prevent air bubbles from being generated and trapped, and the separation and expansion of the adhesives, which damages the package. Consequently, this manufacturing method improves the reliability of semiconductor chip package and makes the thickness of the chip package much thinner than the conventional packages. A liquid insulating adhesive, which has low hydroscopic property, controls air-bubble generation in the inner part of semiconductor package, which helps to prevent damage to the package body from the air bubbles, improving the reliability of semiconductor package through controlling moisture absorption, and cutting down on manufacturing cost owing to no need of another moisture-removing equipment.

While the invention has been described in connection with what is presently considered to be the most practical and preferable embodiments, it is to be understood that the invention is certainly not limited to these disclosed embodiments, but, on the contrary, is intended to cover various modifications and equivalent arrangements included within the spirit and scope of the appended claims.

What is claimed is:

1. A method for manufacturing a semiconductor chip package, comprising the steps of:

providing a wafer having a plurality of semiconductor chips defined thereon, and a lead frame having inner leads and bus bars, wherein each semiconductor chip has a bonding face having circuit patterns formed thereon;

coating a substantially liquid polyimide material on said semiconductor chips defined on said wafer with a thickness of at least about 30 $\mu$m, wherein said liquid polyimide material has a composition of BTDA:PMDA:ODA:SDA=100:0:95:5 parts by weight;

curing said liquid polyimide material, wherein said curing step comprises a first curing step between 250° and 300° C. over about 30 minutes. a second curing step at 300° C. or less for about 60 minutes, and a third curing step between 300° and 250° C. over about 30 minutes;

separating said wafer into said semiconductor chips defined thereon;

attaching said inner leads and said bus bars to the cured polyimide material on one of said semiconductor chips by applying heat and pressure;

forming a semiconductor chip package body enveloping said one of said semiconductor chips and at least a part of said lead frame.

2. The method as claimed in claim 1, wherein said heat and pressure applied during the attaching step are between about 350° C.–400° C. and 20–30 psi, respectively, said heat and pressure being applied for a duration of about 3–5 seconds.

3. The method as claimed in claim 1 wherein the said liquid polyimide material coated in said coating step, has a glass transition temperature of about 254° C.

* * * * *